(12) United States Patent
Yamamoto

(10) Patent No.: US 6,637,010 B2
(45) Date of Patent: Oct. 21, 2003

(54) METHOD AND PROGRAM FOR PROCESSING DESIGN PATTERN OF SEMICONDUCTOR INTEGRATED CIRCUIT

(75) Inventor: Kazuko Yamamoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 09/965,219

(22) Filed: Sep. 27, 2001

(65) Prior Publication Data

US 2002/0038445 A1 Mar. 28, 2002

(30) Foreign Application Priority Data

Sep. 27, 2000 (JP) .................................... P2000-295068

(51) Int. Cl.[7] .............................................. G06F 17/50
(52) U.S. Cl. .............................................. 716/2; 716/1
(58) Field of Search ........................ 716/1–14; 714/1–14

(56) References Cited

U.S. PATENT DOCUMENTS 4,918,614 A * 4/1990 Modarres et al. ............. 716/10
5,191,542 A * 3/1993 Murofushi .................... 716/9

FOREIGN PATENT DOCUMENTS

| JP | 03-080525 | 4/1991 |
| JP | 09-260253 | 10/1997 |

OTHER PUBLICATIONS

Todd J. Wagner, et al., Hierarchical Layout Verification, 21st Design Automation Conference, 1984, pp 484–489.

* cited by examiner

Primary Examiner—Matthew Smith
Assistant Examiner—Sun James Lin
(74) Attorney, Agent, or Firm—Kilpatrick Stockton LLP

(57) ABSTRACT

A method for processing design pattern data of a semiconductor integrated circuit includes determining whether or not there are lower-level cells whose individual size is equal to or below a threshold, and if there are such lower-level cells whose individual size is equal to or below the threshold, collecting the lower-level cells to define a higher-level cell whose size is greater than the threshold and replacing the lower-level cells with the higher-level cell.

14 Claims, 12 Drawing Sheets

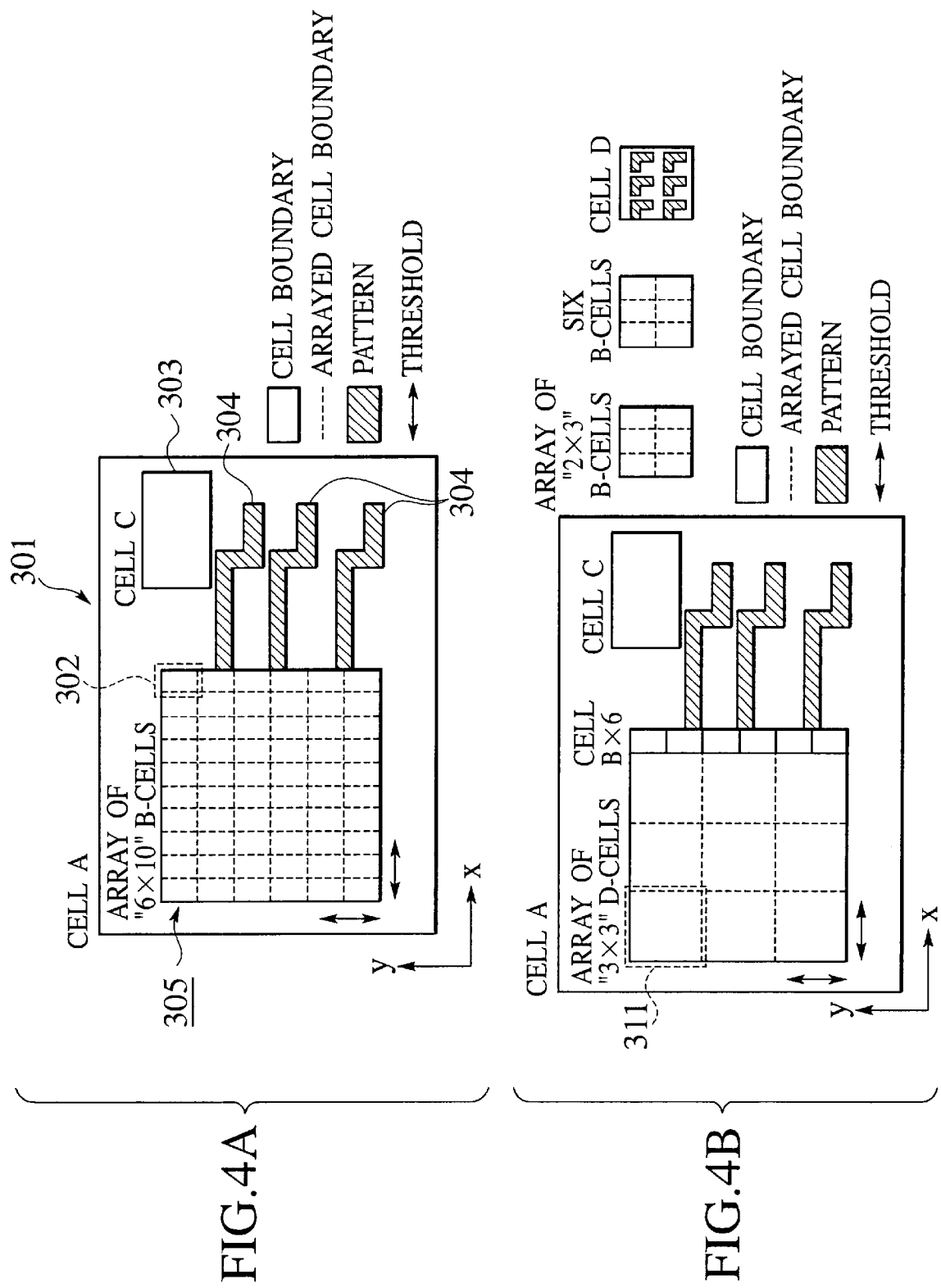

CELL BOUNDARY
PATTERN
THRESHOLD

CELL 101

FIG.8A

| PAIR | APPEARING FREQUENCY |
|------|---------------------|
| 1-2  | 7 |
| 6-1  | 4 |
| 1-7  | 4 |
| 5-6  | 2 |
| 2-6  | 2 |
| 7-1  | 2 |

FIG.8B

| PAIR  | APPEARING FREQUENCY |
|-------|---------------------|
| 6-1   | 4 |
| 1-7   | 4 |
| 5-6   | 2 |
| 7-101 | 2 |

FIG.8C

| PAIR  | APPEARING FREQUENCY |
|-------|---------------------|
| 102-7 | 4 |

METHOD AND PROGRAM FOR PROCESSING DESIGN PATTERN OF SEMICONDUCTOR INTEGRATED CIRCUIT

CROSS REFERENCE TO RELATED APPLICATIONS

This application is based upon and claims the benefit of priority from the prior Japanese Patent Application No. 2000-295068 filed on Sep. 27, 2000, the entire contents of which are incorporated herein by reference.

BACKGROUND OF THE INVENTION

1. Field of the Invention

The present invention relates to a method of and a program of processing design pattern data of a semiconductor integrated circuit such as an LSI. In particular, the present invention relates to checking LSI patterns by design rules, preparing mask writing data, and correcting optical or electron beam proximity effect.

2. Description of the Related Art

LSIs are getting denser and finer to increase the amount of design pattern data involved. To minimize design pattern data, hierarchical processing is imperative.

A hierarchical processing technique to correct a proximity effect is disclosed in Japanese Patent Publication No. 03-80525 "Correcting Method for Proximity Effect" (first related art).

The hierarchical processing technique of the first related art will be explained with reference to FIG. 1. A higher-level cell A (901) contains a lower-level cell B (902). Double frame areas defined by frames A (911) and B (912) are prepared inside the boundary of the cell B.

When processing the cell B to correct a proximity effect, an inside area of the frame 911 is set as a proximity effect correction area and an area between the boundary of the cell B and the frame 911 is set as a reference area.

When processing the cell A to correct a proximity effect, the area between the cell B and the frame 911 is added as a proximity effect correction area, and an area between the frames 911 and 912 is set as a reference area.

The reason why a reference area defined by frames is set inside or outside a proximity effect correction area is to cope with the influence of back scattering electrons from the reference area. Accordingly, the size of a reference area defined by frames is dependent on a scattering length of back scattering electrons.

A hierarchical processing technique to check patterns by design rules is disclosed in Todd J. Wagner of Intel Corp., "Hierarchical Layout Verification," 21st Design Automation Conference, pp. 484–489, 1984 (second related art). This hierarchical processing technique finds space and width violations based on design rules and is substantially equal to the technique of FIG. 1. The second related art determines the width of a frame area according to spaces and widths to check.

A hierarchical processing technique to prepare mask writing data is disclosed in Japanese Patent Publication No. 09-260253 "Charged Beam Image Sensing Data Forming Method" (third related art). This technique flattens each lower-level cell whose size is below a threshold into a higher level and prepares data to draw a mask. The third related art flattens an array of lower-level cells into a higher level if the area of the array is small, or if the number of cells in the array is small.

SUMMARY OF THE INVENTION

A method according to an embodiment of the present invention includes determining whether or not there are lower-level cells whose individual size is equal to or below a threshold, and if there are such lower-level cells, collecting the lower-level cells to define a new cell whose size is greater than the threshold, and replacing the lower-level cells with the new cell.

BRIEF DESCRIPTION OF THE DRAWINGS

FIGS. 3A and 3B are flowcharts partly showing processes according to a first embodiment of the present invention carried out with a hierarchy optimizer 112 (FIG. 2), in which FIG. 3A shows a process of combining arrayed cells into new arrayed cells and FIG. 3B shows a process of combining arrayed cells into new arrayed cells without leaving a remainder;

FIGS. 4A and 4B are layout models explaining the first embodiment in which FIG. 4A shows a layout model involving an array 305 of six B-cells in y-direction and ten B-cells in x-direction and FIG. 4B shows a layout model with the cells B in the array 305 being mostly replaced with cells D;

FIGS. 5A to 5D are flowcharts showing processes according to a second embodiment of the present invention carried out with the hierarchy optimizer 112, in which FIG. 5A shows a process of defining a most frequently appearing cell pair as a new master cell, FIG. 5B shows a process of defining a cell pair having the largest data quantity as a new master cell if there are two or more most frequently appearing cell pairs of different cell combinations, FIG. 5C shows a process of defining a cell pair containing the largest number of objects including arrays, cells, and patterns as a new master cell if there are two or more most frequently appearing cell pairs of different cell combinations, and FIG. 5D shows a process of defining a cell pair having the largest size as a new master cell if there are two or more most frequently appearing cell pairs of different cell combinations;

FIGS. 6A and 6B are cell layouts explaining the second embodiment in which FIG. 6A shows a layout of individual cells and FIG. 6B shows a layout with each combination of cells 1 and 2 being paired to define a cell 101 and replaced with the same;

FIGS. 7A and 7B are cell layouts explaining the second embodiment in which FIG. 7A shows a layout with each combination of cells 6 and 1 being paired to define a cell 102 and replaced with the same and FIG. 7B shows a layout with each combination of cells 102 and 7 being paired to define a cell 103 and replaced with the same;

FIGS. 8A to 8C are tables showing the appearing frequencies of cell pairs in which FIG. 8A corresponds to the layout of FIG. 6A, FIG. 8B to that of FIG. 6B, and FIG. 8C to that of FIG. 7A.

DETAILED DESCRIPTION OF THE INVENTION

The first and second related arts flatten every pattern contained in a lower-level cell into a higher level if the lower-level cell is smaller than twice a frame width. In this case, the related arts provide no advantage of hierarchical processing because every pattern is processed in the higher level.

The third related art flattens small lower-level cells into a higher level, and thus obtains no advantage of hierarchical processing. If the third related art flattens an array of lower-level cells into a higher level, it raises the problem of drastically increasing the amount of data to be processed.

An object of embodiments of the present invention is to solve these problems and provide a method of and a program of processing design pattern data of a semiconductor integrated circuit, capable of avoiding the flattening of an array of small lower-level cells into a higher level, to thereby hierarchically process even the small lower-level cells.

Various embodiments of the present invention will be described with reference to the accompanying drawings.

(1) First Embodiment

Figure 1:
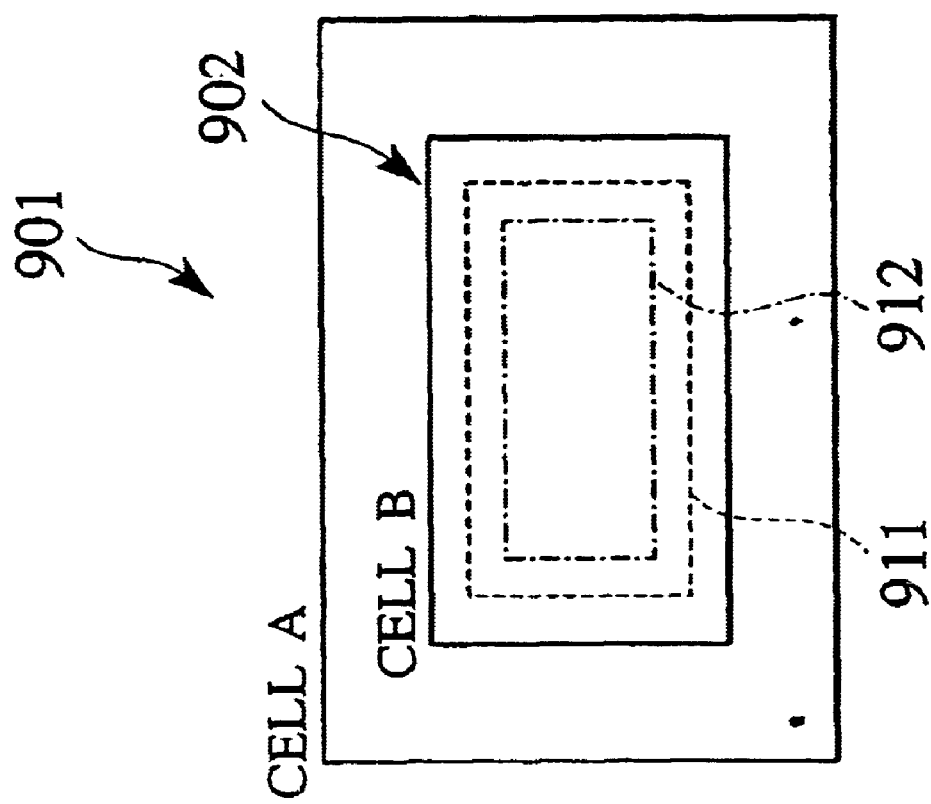
FIG. 1 explains the hierarchical processing technique of the first related art studied by the present inventor.
Figure 2:
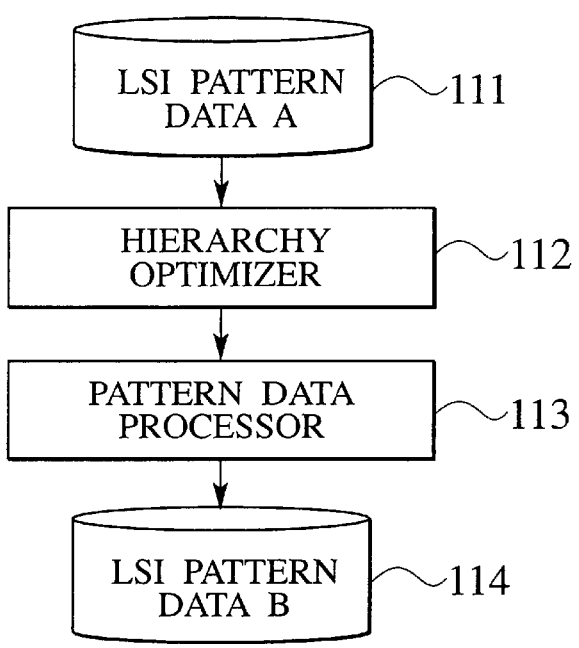
FIG. 2 shows a data flow in an LSI data processing system studied by the inventor.

FIG. 2 shows a data flow in an LSI data processing system studied by the inventor. LSI pattern data A (111) is hierarchically optimized by a hierarchy optimizer 112 and is processed by a pattern data processor 113, to provide LSI pattern data B (114).

Although processes carried out with the hierarchy optimizer 112 differ depending on the LSI data processing system, the hierarchy optimizer 112 essentially executes (a) checking overlapping of cells and patterns and flattening them into a higher hierarchical level, (b) classifying cells in an array into peripheral cells and internal cells and reconfiguring the array, and (c) flattening a frame area of a lower-level cell into a higher-level cell.

The pattern data processor 113 carries out distance inspection, correction of electron beam proximity effect and optical proximity effect, etc., depending on the LSI data processing system.

Figure 3A:
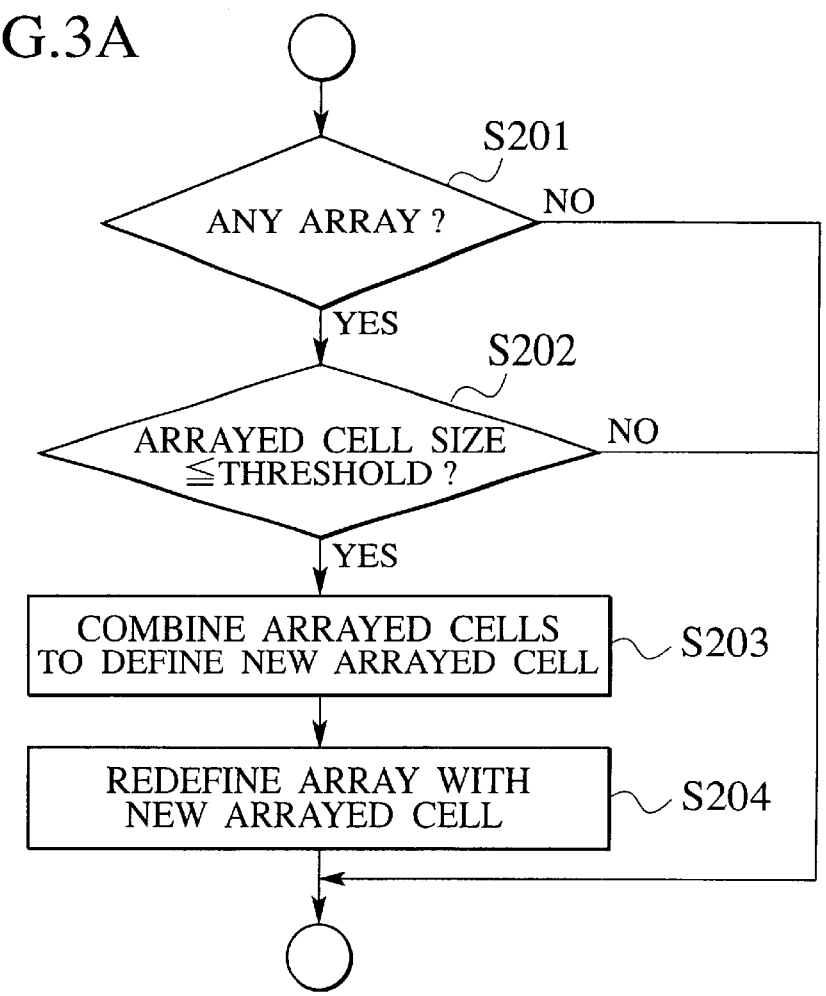
Figure 3B:
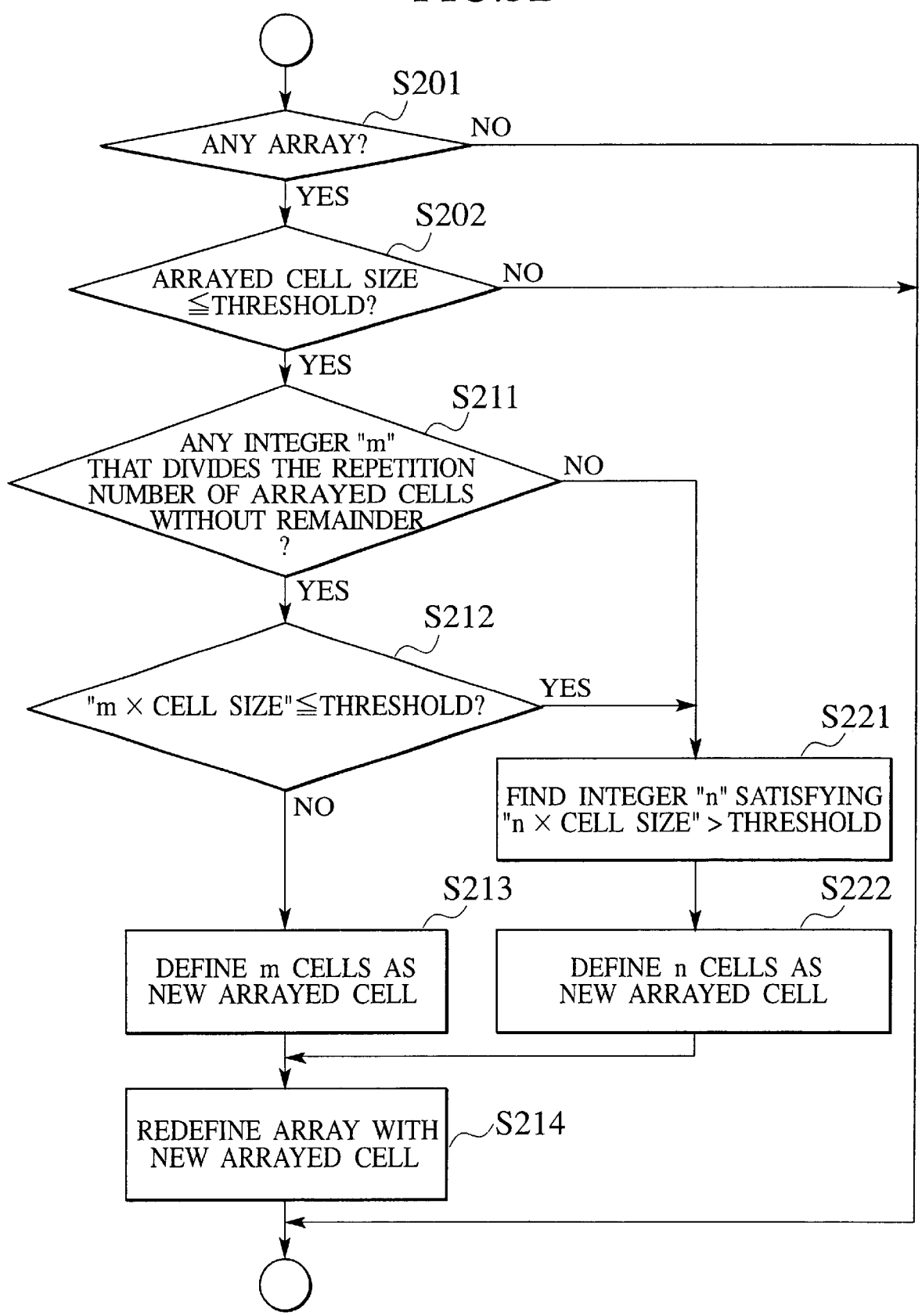

FIGS. 3A and 3B are flowcharts partly showing processes according to the first embodiment of the present invention carried out with the hierarchy optimizer 112 on each cell. The processes shown in FIGS. 3A and 3B are preferably carried out before standard hierarchy optimizing processes. Namely, combining arrayed cells into new arrayed cells according to the first embodiment is preferably carried out before the processes of (a) checking overlapping of cells and patterns and flattening them into a higher hierarchical level, (b) classifying cells in an array into peripheral cells and internal cells and reconfiguring the array, and (c) flattening a frame area of a lower-level cell into a higher-level cell.

The flowchart of FIG. 3A will be explained with reference to FIGS. 4A and 4B. FIG. 4A shows a cell A (301) to be processed. The cell A contains an array 305, a cell C (303), and three patterns 304. The array 305 consists of 60 cells B (302) arrayed in six rows in a y-direction and ten columns in an x-direction. For example, the cell B is a memory cell, the cell C is a control logic, and the patterns 304 are interconnects.

Step S201 of FIG. 3A checks to see if the cell A contains an array. The cell A contains the array 305 made of the cells B in this example, and therefore, step S201 advances to step S202.

Step S202 checks to see if the size of each cell B is equal to or below a threshold. In this example, each cell B in the array 305 is below the threshold, and therefore, the flow goes to step S203. The "threshold" will be explained later.

Step S203 is carried out if one of the x- and y-direction lengths of the cell B in the array 305 is equal to or below the threshold.

Combining three of the cells B in the x-direction and two in the y-direction exceeds the threshold in both the x- and y-directions. Step S203, therefore, defines a new arrayed cell D (311) by combining three cells B in the x-direction and two cells B in the y-direction.

FIG. 4B shows the cell D. The cell D is defined as (a) an array of six cells B in two rows in the y-direction and three columns in the x-direction, (b) an arrangement of six cells B, or (c) flattened six cells B.

(a) Defining the cell D as an array of six cells B in two rows in the y-direction and three columns in the x-direction is made with the following data:

data indicating that the cell B is an arrayed cell;

data indicating that the cell B is repeatedly arranged in two rows in the y-direction and three columns in the x-direction;

cell arranging pitch data, i.e., a y-direction size of the cell B and an x-direction size of the cell B; and data indicating the coordinates of a start point of the repetition of the cell B.

(b) Defining the cell D as an arrangement of six cells B is made with the following data:

data indicating that the cell B is a master cell; and data indicating the coordinates of each of the six cells B.

(c) Defining the cell D as flattened six cells B is made by replacing each of the "3×2" cells B with data set in the cell B. According to the example of FIG. 4B, each cell B contains an inverted L-shaped pattern, and therefore, each cell B is replaced with this pattern.

Step S204 redefines the array 305 consisting of the cells B in six rows in the y-direction and 10 columns in the x-direction into a new array including the cells D in three rows in the y-direction and three columns in the x-direction. At this time, six cells B remain at the end of the x-direction. These remainder cells B may be defined as (a) a one-dimensional array of the cells B, (b) a y-direction arrangement of the cells B, or (c) flattened six cells B.

(a) Defining the six remainder cells B as a one-dimensional array of the cells B is made with the following data:

data indicating that the cell B is an arrayed cell;

data indicating that the cell B is repeatedly arranged in six rows in the y-direction and one column in the x-direction;

cell arranging pitch data, i.e., a y-direction size of the cell B and an x-direction size of the cell B; and data indicating the coordinates of a start point of the repetition of the cell B.

(b) Defining the six remainder cells B as a y-direction arrangement of the cells B is made with the following data:

data indicating that the cell B is a master cell; and data indicating the coordinates of each of the six cells B.

(c) Defining the six remainder cells B as flattened six cells B is made by replacing each of the six cells B with data set in the cell B. In FIG. 4B, each cell B contains an inverted L-shaped pattern, and therefore, each cell B is replaced with this pattern.

In the example of FIG. 4B, the six remainder cells B are defined as a y-direction arrangement of the cells B.

When step S203 combines several arrayed cells into a new arrayed cell, the y- and x-direction dimensions of the new arrayed cell must each exceed the threshold.

When combining arrayed cells that form an array into a new arrayed cell, it is preferable to leave no remainder cells. This is achievable by the flow of FIG. 3B. Step S211 of FIG.

3B checks to see if there is a number "m" that divides repetition number of arrayed cells in a given array without leaving a remainder. If there is such a number m, step S212 checks to see if the size of a new arrayed cell formed by combining the m arrayed cells together is equal to or below a threshold. If the size is greater than the threshold, step S213 defines the new arrayed cell by combining the m arrayed cells together.

In the example of FIG. 4B, the array 305 includes ten columns of the cells B in the x-direction, and therefore, it is preferable to collect every five or two cells B in the x-direction. At this time, the size of a new cell to be made must exceed the threshold, and therefore, collecting every two cells B in the x-direction is unacceptable.

The "threshold" will be explained. The threshold is preferable to be twice as large as a frame width used to flatten a frame area of a lower-level cell into a higher-level cell. The frame width is equal to (a) a maximum inspection distance in design rule checking, (b) a scattering length of back scattering electrons in electron beam proximity effect correction, and (c) a distance of optical proximity effect in optical proximity effect correction. Combining cells smaller than a threshold into a larger cell prevents an array of cells from being entirely flattened into a higher level.

As mentioned above, the first embodiment combines small arrayed cells into larger arrayed cells and reconfigures the array with the larger arrayed cells, thereby preventing the array from being entirely flattened and making the best use of hierarchical processing.

The first embodiment combines arrayed cells smaller than a threshold to define a new arrayed cell and redefines an array by the new arrayed cell, thereby preventing the array of the small arrayed cells from being entirely flattened.

Even if hierarchically processed, every cell that is equal to or below a threshold is flattened when correcting a proximity effect. The correction of a proximity effect, in particular, an electron beam proximity effect or an optical proximity effect involves a large reference distance, which causes a large number of cells to be flattened. Therefore, combining small cells into a larger cell larger than twice the reference distance prevents the flattening of the small cells and avoids an explosion of data quantity.

(2) Second Embodiment

FIGS. 5A to 5D are flowcharts showing processes according to the second embodiment of the present invention carried out with the hierarchy optimizer 112 on each cell. It is preferable to carry out the flows of FIGS. 5A to 5D after combining small cells into a larger cell according to the first embodiment and before carrying out the standard hierarchical optimization. Namely, combining small cells into a larger cell is carried out according to the first embodiment, and then, the second embodiment pairs cells and forms new cells. Thereafter, the processes of (a) checking overlapping of cells and patterns and flattening them into a higher hierarchical level, (b) classifying cells in an array into peripheral cells and internal cells and reconfiguring the array, and (c) flattening a frame area of a lower-level cell into a higher-level cell are carried out.

The flowchart of FIG. 5A will be explained with reference to FIGS. 6A and 6B that show layouts of standard cells. These cells have an identical y-direction length and are lined in the x-direction. Namely, the cells have a fixed y-direction length of several tens of micrometers and different x-direction lengths. Instead, the cells may have different y-direction lengths and a fixed x-direction length.

Figure 6A:
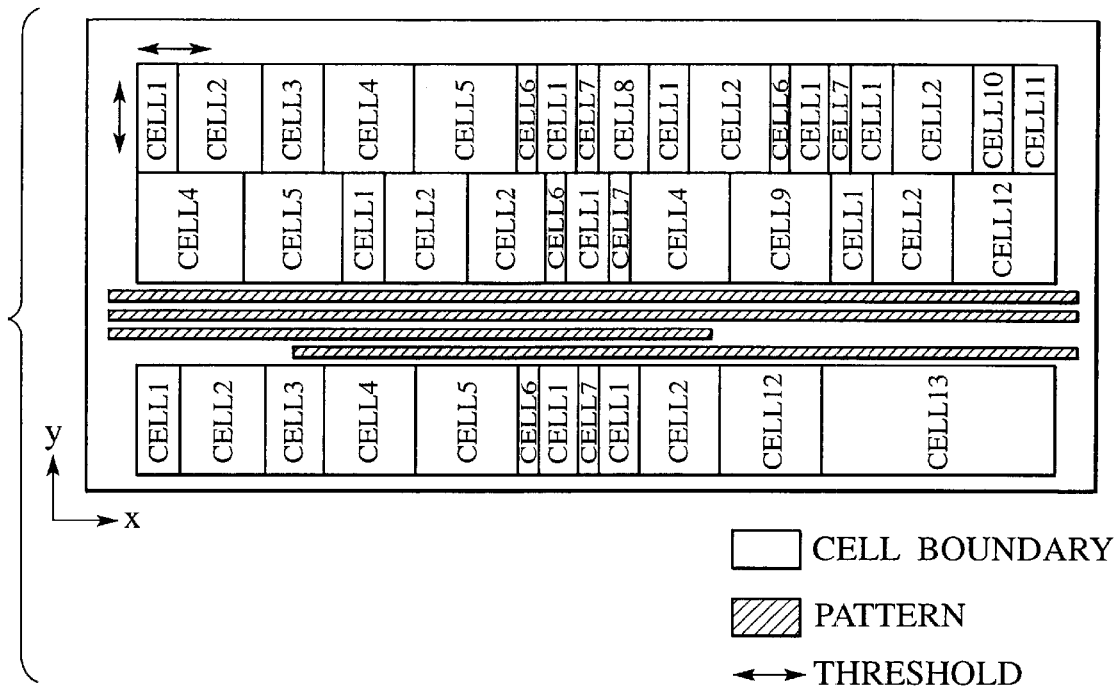

In FIG. 6A, the cells 1 to 13 have the fixed y-direction length that is greater than a threshold and different x-direction lengths among which some are equal to or below a threshold and some are above the threshold.

Step S401 of FIG. 5A finds cells whose x-direction lengths are equal to or below a threshold. In the example of FIG. 6A, the cells 1, 6, 7, 8, 10, and 11 are found to have x-direction lengths each being equal to or below the threshold.

Step S402 pairs each of the below-threshold cells with an adjacent cell. Step S403 counts the appearing frequencies of the pairs and sorts the frequencies in descending order.

FIG. 8A is a table showing the sorted pairs. Any pair having an appearing frequency of one is excluded from the table.

The second embodiment replaces each pair that appears more than two times with a new cell. Namely, step S404 of FIG. 5A sets N=2. There will be no advantage of carrying out hierarchical processing on a pair appearing only once, and therefore, the second embodiment sets N to 2 or over.

In the example of FIG. 6A, the most frequently appearing pair is a pair 1–2, i.e., a pair of the cells 1 and 2 that appears seven times. Step S405 of FIG. 5A defines the pair 1–2 as a new cell 101 and replaces every pair 1–2 with the cell 101.

Figure 6B:
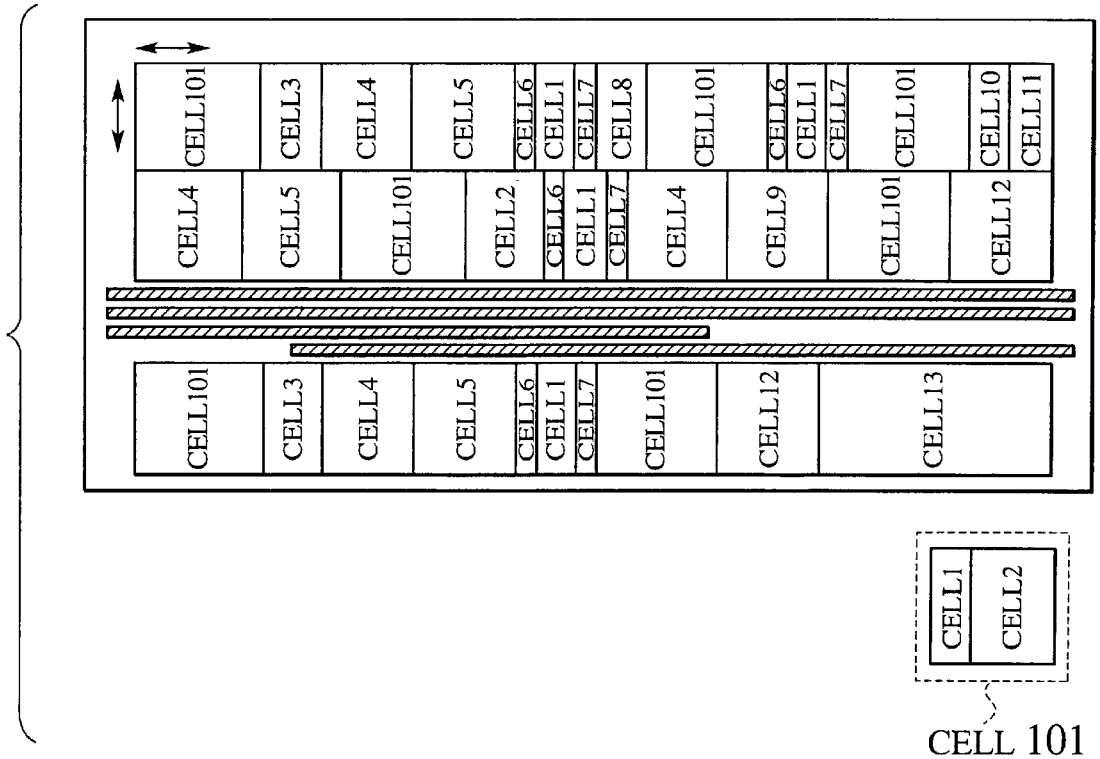

FIG. 6B shows a layout including the cells 101 each replacing the pair of the cell 1 and cell 2.

After step S405 of FIG. 5A, the flow returns to step S401 to find any cell whose x-direction length is equal to or below the threshold. The cells 1, 6, 7, 8, 10, and 11 are found to have x-direction lengths each being equal to or below the threshold.

Step S402 pairs each of the equal to or below threshold cells with an adjacent cell. Step S403 counts the appearing frequencies of the pairs and sorts the frequencies in descending order.

FIG. 8B is a table showing the sorted pairs. There are two combinations in the most frequently appearing pairs, i.e., a pair 6-1 of the cells 6 and 1 with an appearing frequency of 4 and a pair 1-7 of the cells 1 and 7 with an appearing frequency of 4.

If there are a plurality of combinations in the most frequently appearing pairs like this example, data quantities of cells of each combination are summed and the summed data quantities of the combinations are compared with each other. A pair of the combination having the largest total data quantity is selected as a replacement target pair. Instead, the numbers of objects contained in the cells of each combination are summed and the summed object numbers of the combinations are compared with each other. A pair of the combination having the largest total object number is selected as a replacement target pair. Alternatively, the x-direction lengths of the cells of each combination are summed and the total x-direction lengths of the combinations are compared with each other. A pair of the combination having the largest x-direction length is selected as a replacement target pair.

Figure 5A:
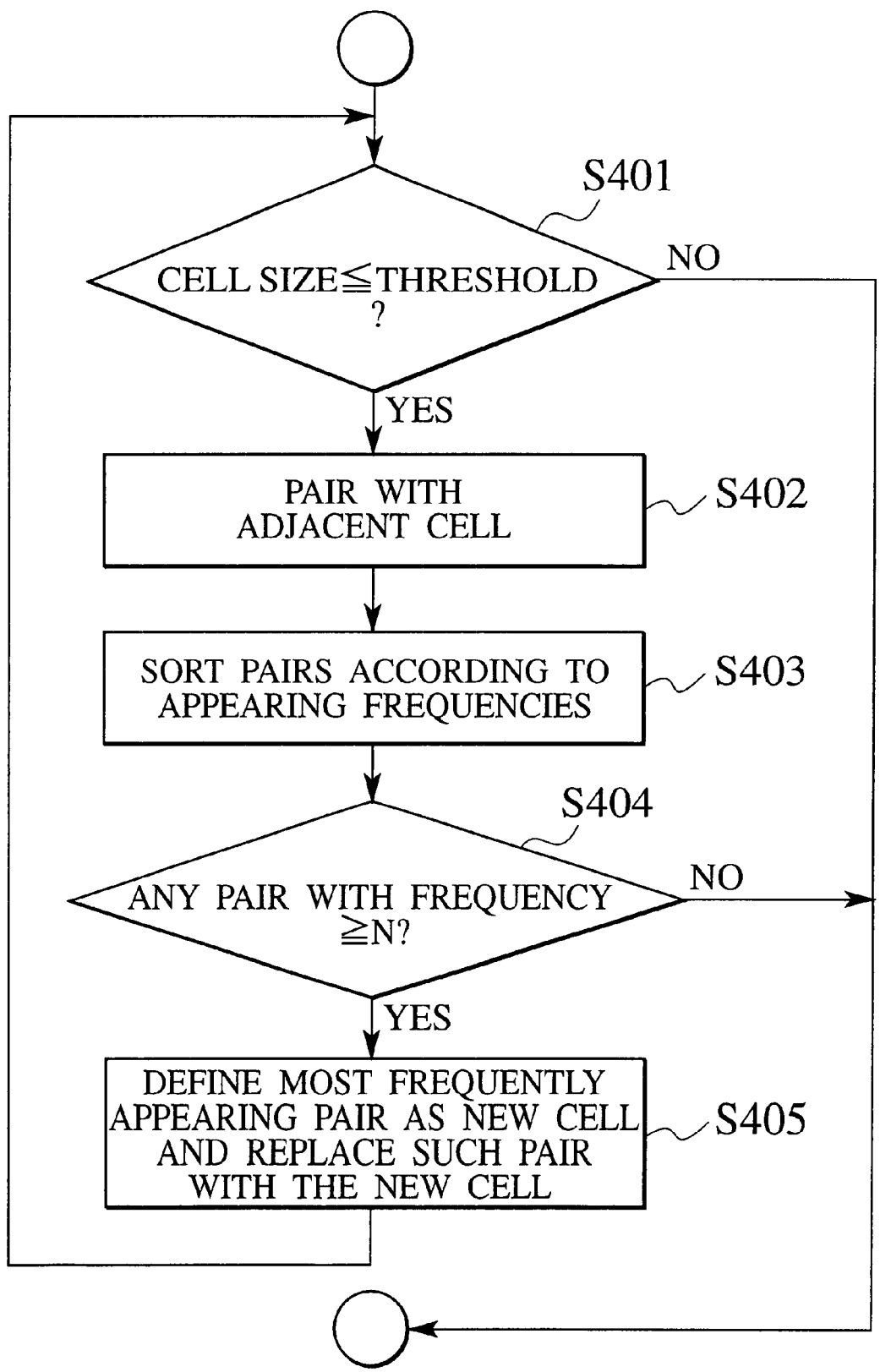
Figure 5B:
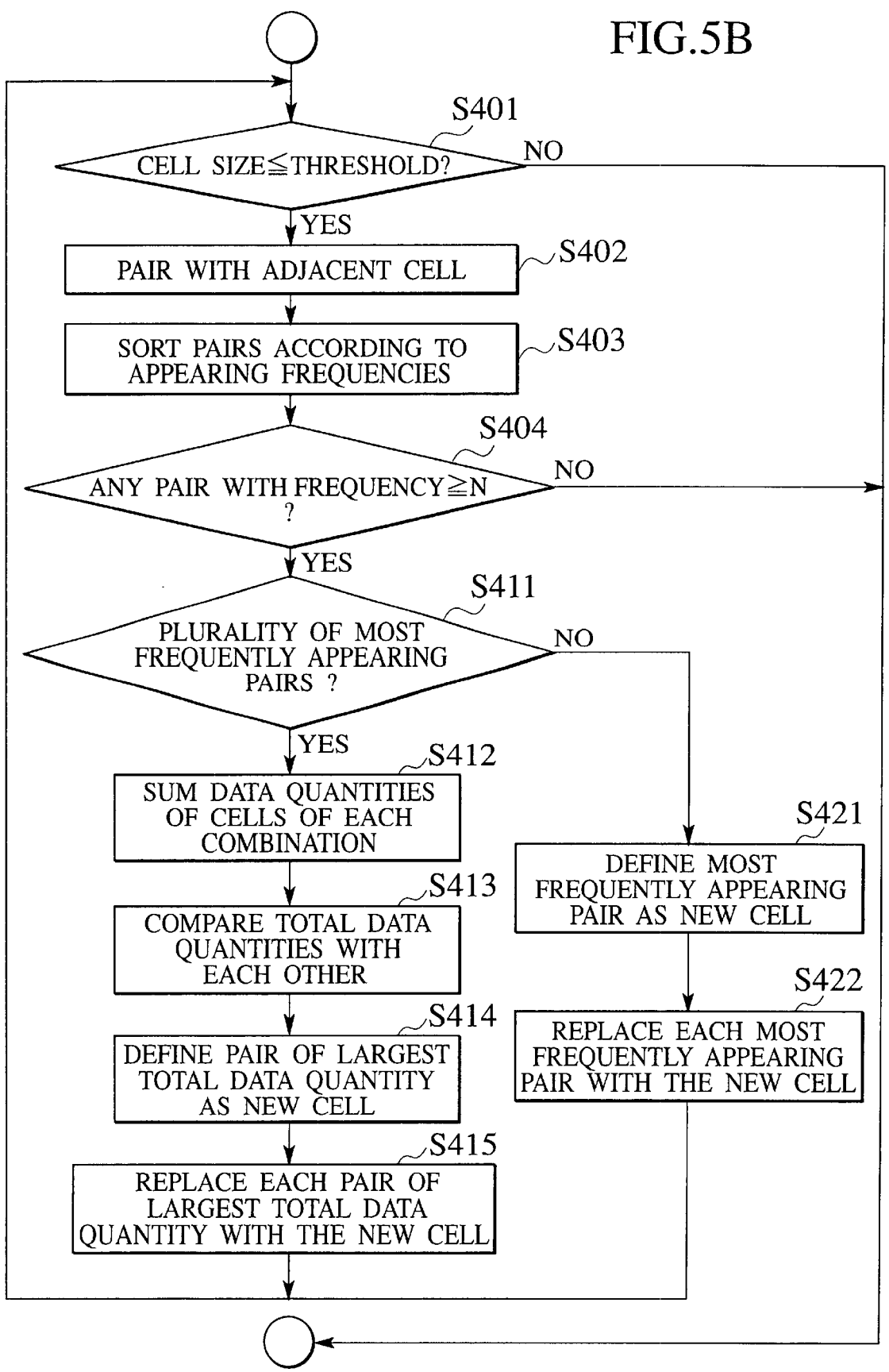

FIG. 5B shows a process of defining a cell pair having the largest data quantity as a new cell (higher-level cell) if there are two or more most frequently appearing cell pairs of different cell combinations.

Step S411 checks to see if there are a plurality of most frequently appearing cell pairs of different cell combinations. Step S411 is YES in this example, and step S412 sums data quantities in the cells of each cell combination. Step S413 compares the summed data quantities of the cell combinations with each other. Step S414 selects the cell combination having the largest total data quantity, to define a new cell (higher-level cell). Step S415 replaces each pair of the selected cell combination with the new cell.

Figure 5C:
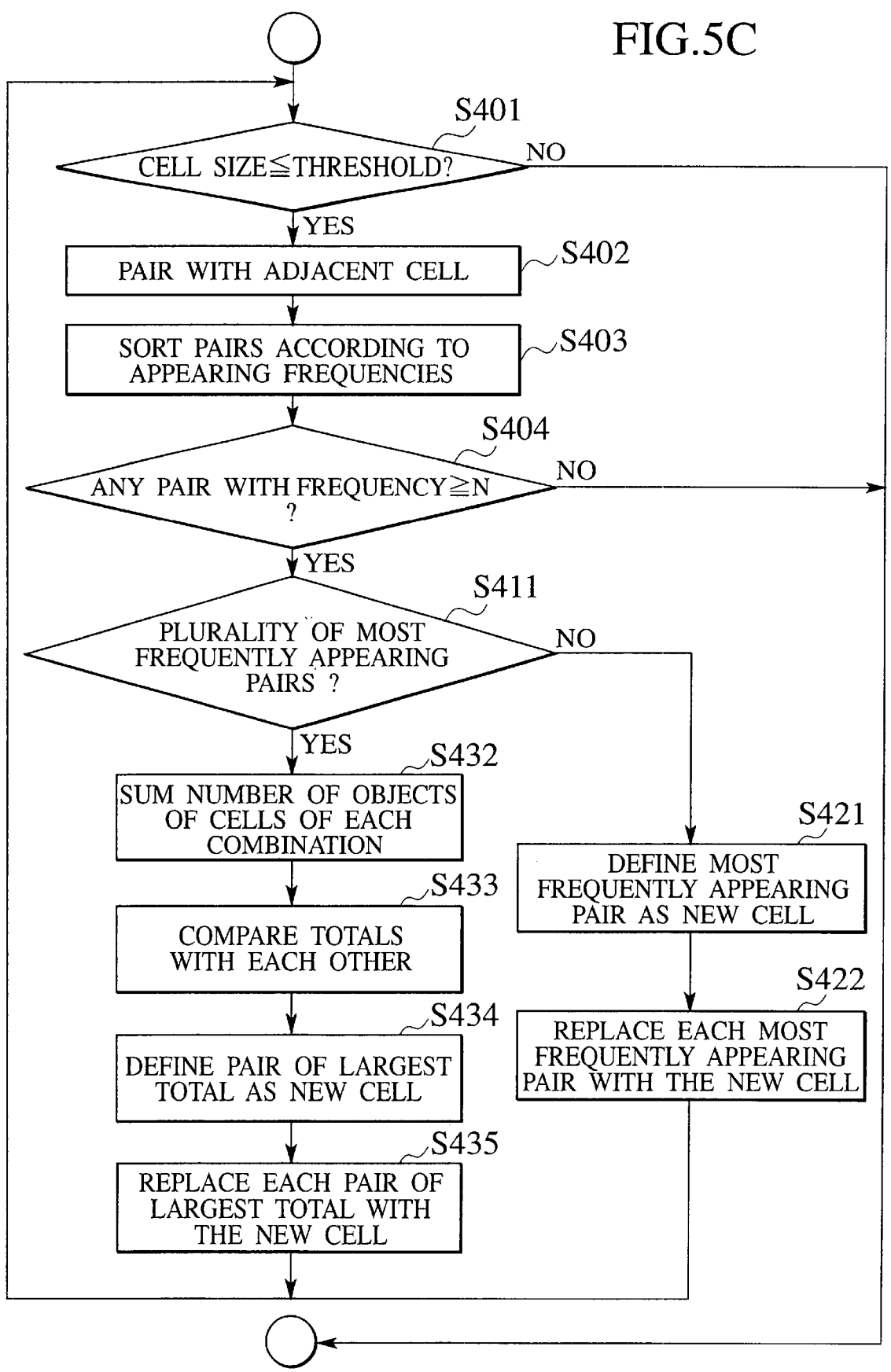

FIG. 5C shows a process of defining a cell pair having the largest number of objects such as arrays, cells, and patterns as a new cell (higher-level cell) if there are two or more most frequently appearing cell pairs of different cell combinations.

Step S411 checks to see if there are a plurality of most frequently appearing cell pairs of different cell combinations. Step S411 is YES in this example, and step S432 sums the numbers of objects contained in the cells of each cell combination. Step S433 compares the summed object numbers of the cell combinations with each other. Step S434 selects the cell combination having the largest total object number, to define a new cell (higher-level cell). Step S435 replaces each pair of the selected cell combination with the new cell.

Figure 5D:
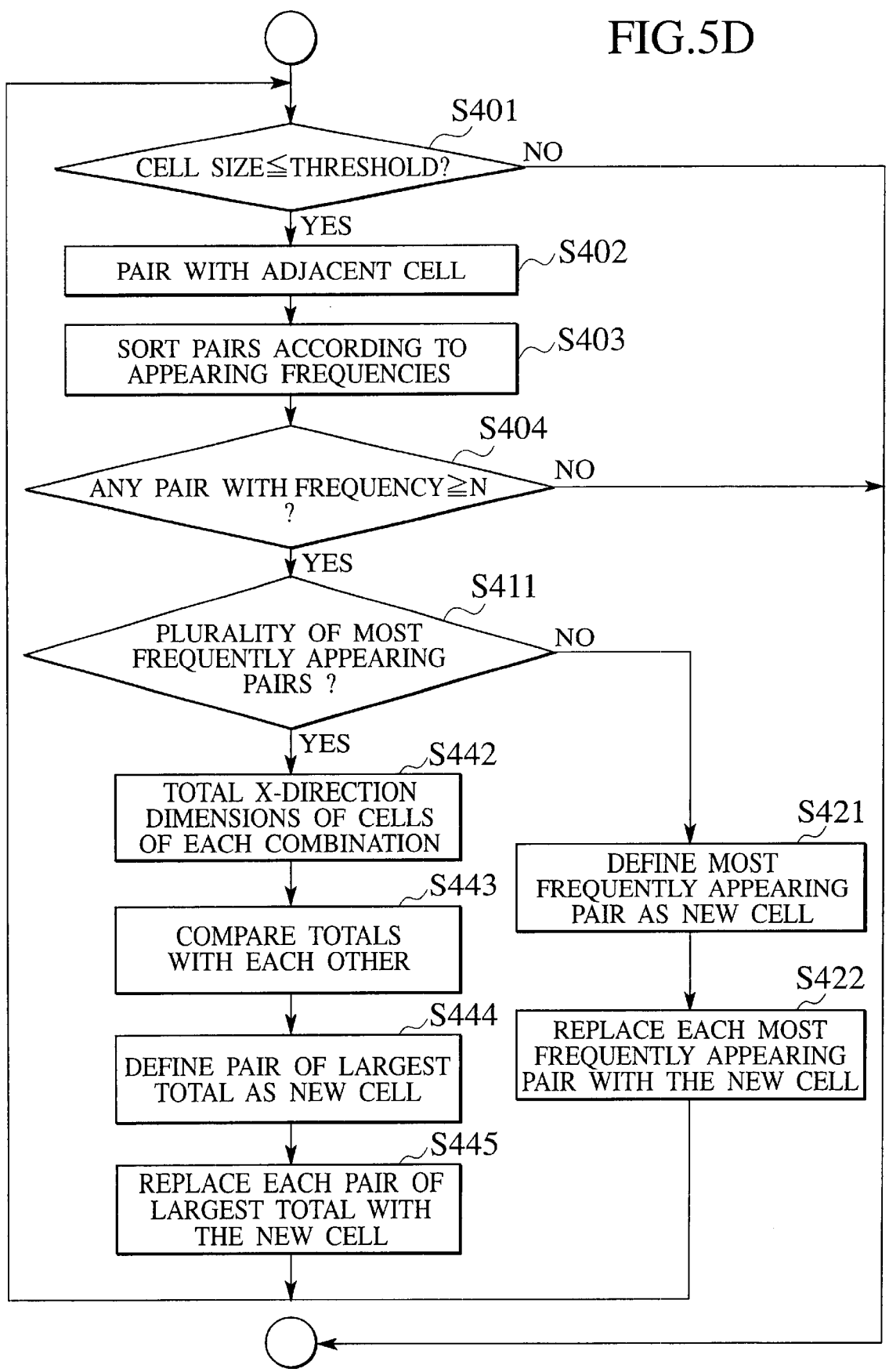

FIG. 5D shows a process of defining a cell pair of the largest size as a new cell (higher-level cell) if there are two or more most frequently appearing cell pairs of different cell combinations.

Step S411 checks to see if there are a plurality of most frequently appearing cell pairs of different cell combinations. Step S411 is YES in this example, and step S442 sums the x-direction lengths of the cells of each cell combination. Step S443 compares the total x-direction lengths of the cell combinations with each other. Step S444 selects the cell combination having the largest total x-direction length, to define a new cell (higher-level cell). Step S445 replaces each pair of the selected cell combination with the new cell.

According to the second embodiment, step S405 of FIG. 5A defines the pair 6-1 as a new cell 102 and replaces every pair 6-1 with the cell 102.

Figure 7A:
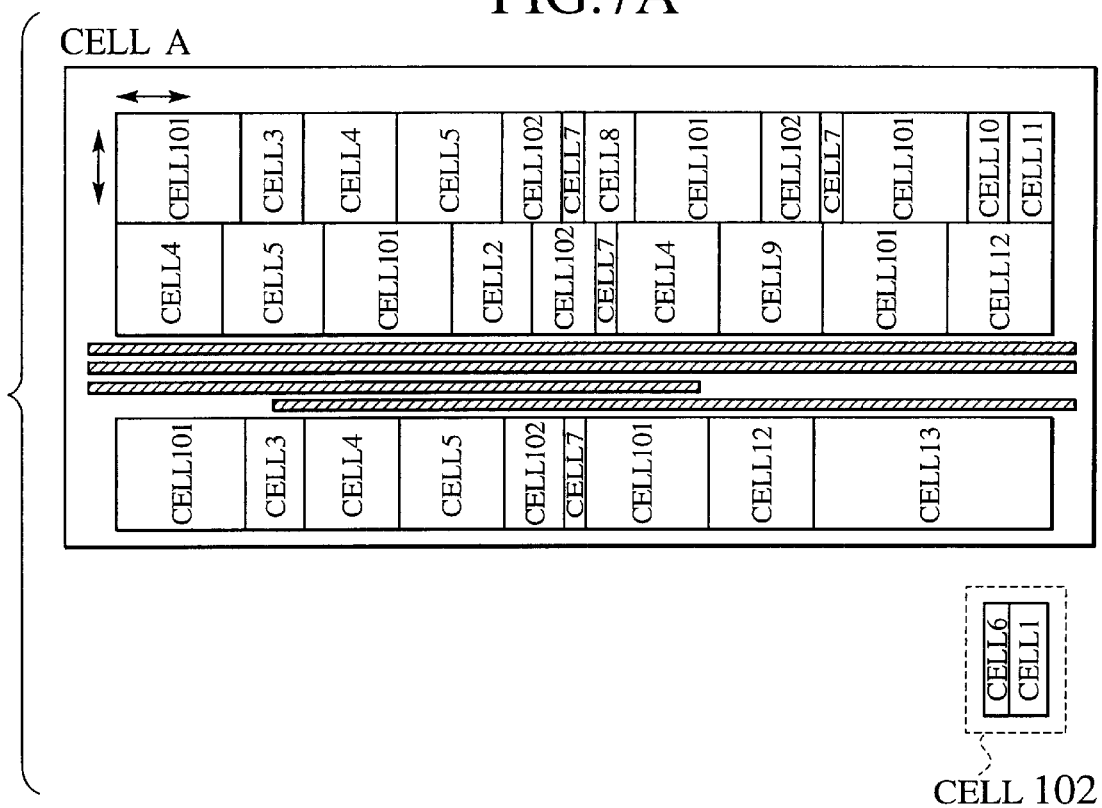

FIG. 7A is a layout including the cells 102 each replacing the pair of the cell 6 and cell 1.

The flow again returns to step S401 of FIG. 5A to find any cell whose x-direction length is equal to or below the threshold. The cells 7, 8, 10, 11, and 102 are found to have x-direction lengths each being equal to or below the threshold.

Step S402 pairs each of the equal to or below threshold cells with an adjacent cell. Step S403 counts the frequencies of the pairs combination by combination and sorts the frequencies in descending order.

FIG. 8C is a table showing the sorted pairs. There is only one combination of pair, i.e., a pair 102-7 that appears more than two times. Step S405 of FIG. 5A defines the pair 102-7 as a new cell 103 and replaces every pair 102-7 with the cell 103.

Figure 7B:
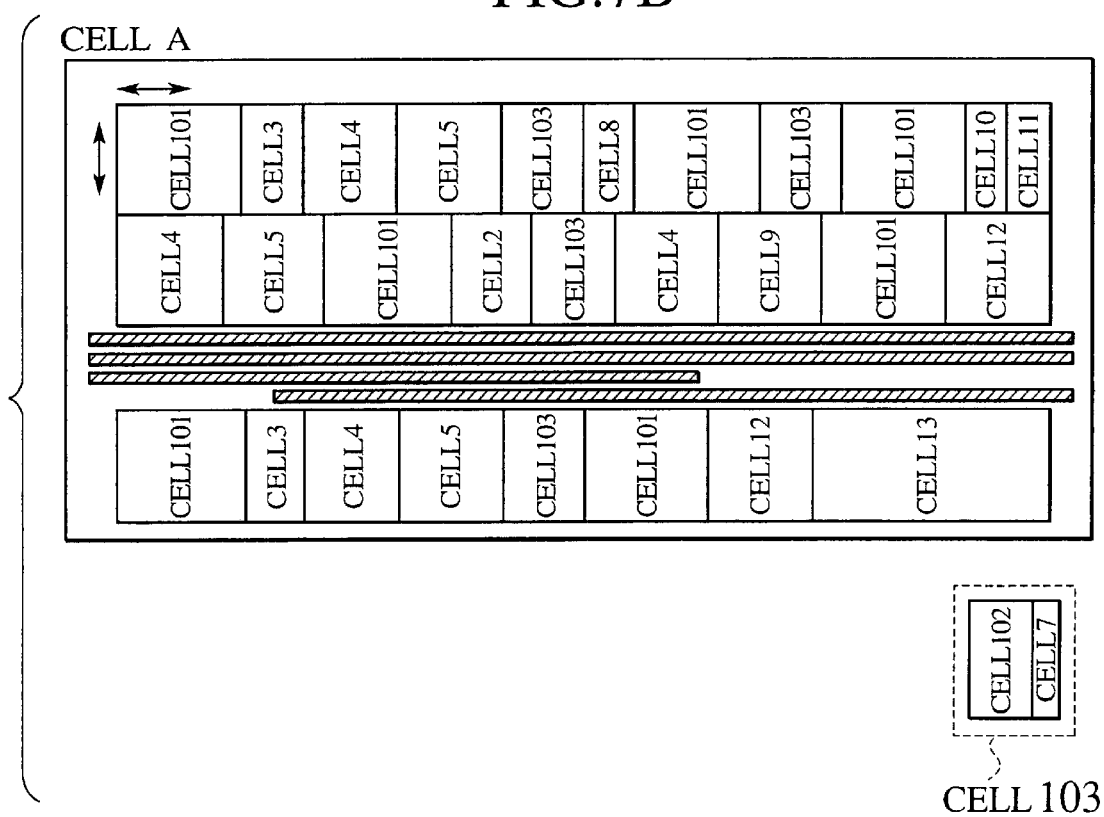

FIG. 7B is a layout including the cells 103 each replacing the pair of the cell 102 and cell 7.

The flow again returns to step S401. In step S404, it is determined that there is no pair that appears more than two times, and therefore, the flow ends.

The threshold will be explained. The threshold is preferable to be twice as large as a frame width used to flatten a frame area of a lower-level cell into a higher-level cell. The frame width is a distance to be referred to when carrying out graphic data processing and is equal to (a) a maximum inspection distance in design rule checking, (b) a scattering length of back scattering electrons in electron beam proximity effect correction, and (c) a distance of optical proximity effect in optical proximity effect correction. Collecting cells that are smaller than a threshold into a larger cell prevents an array of lower-level cells from being entirely flattened into a higher level.

The second embodiment pairs a small discrete cell with an adjacent cell to define a larger cell, thereby preventing the small discrete cell from being entirely flattened. On pattern data to which such pairing is repeatedly executable, the second embodiment particularly demonstrates the effect of hierarchical processing.

When handling standard cells such as those shown in FIG. 6A, the second embodiment collects discrete cells smaller than a threshold into a larger cell, so that the small discrete cells may hierarchically be processed.

The steps of the present invention mentioned above may be described as a computer program that is storable in a storage medium. The program in the storage medium is read and executed by a computer, to achieve the steps of the present invention. The storage medium may be a memory, a magnetic disk, an optical disk, a magnetic tape, etc., capable of storing programs.

Figure 9:
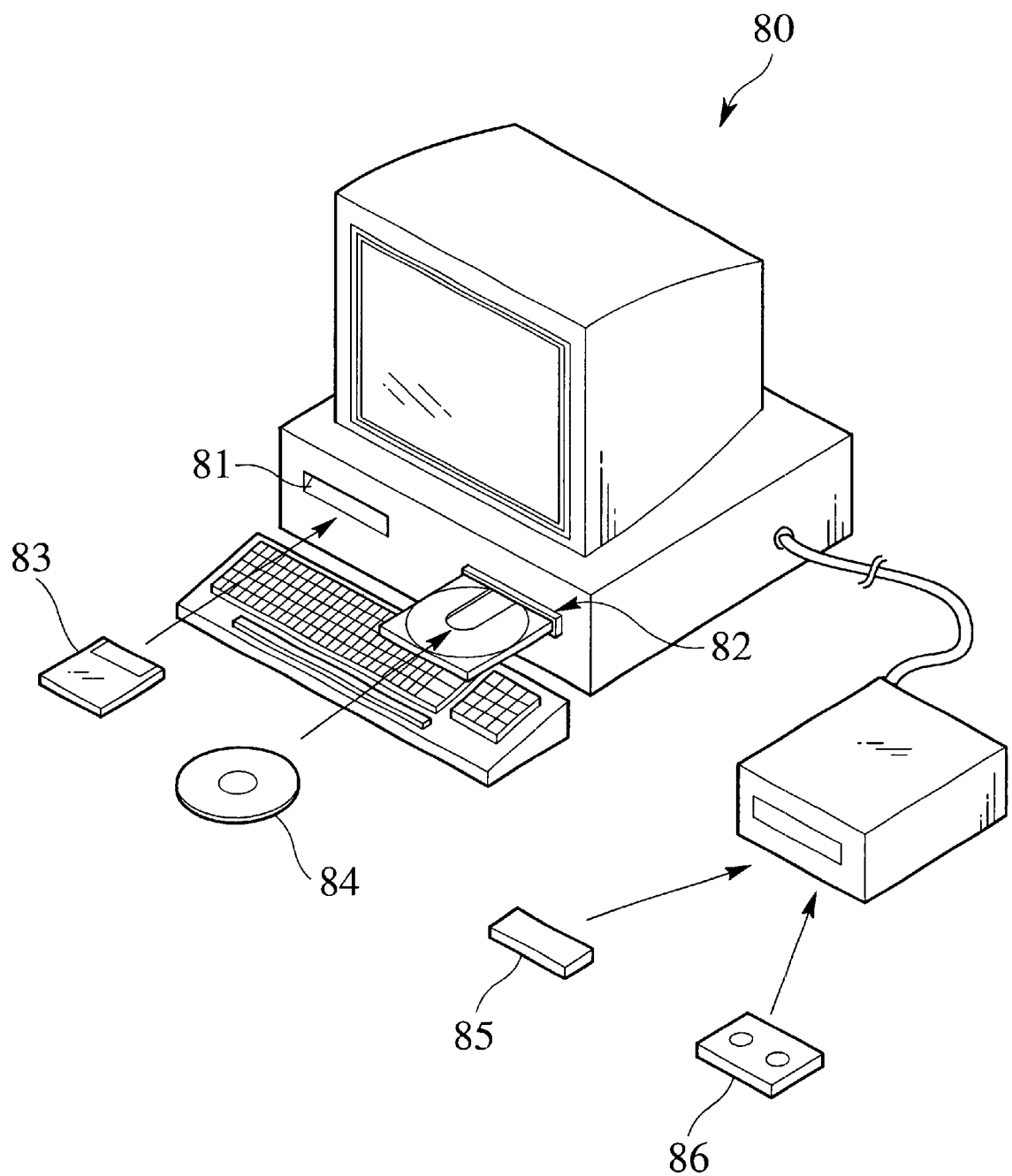
FIG. 9 is a perspective view showing an example of a computer system that reads a program from a storage medium and processes circuit pattern data according to steps described in the program.

FIG. 9 is a perspective view showing an example of a computer system that reads a program from a storage medium and processes data according to steps described in the program. The computer system 80 has a floppy disk drive 81 and a CD-ROM drive 82. The drives 81 and 82 receive a magnetic floppy disk 83 and an optical CD-ROM 84, respectively. The disks 83 and 84 store programs that are read by and installed in the computer system 80. The computer system 80 may be connected to another drive to handle a ROM 85 serving as, for example, a game pack and a magnetic cassette tape 86.

Any one of the storage media mentioned above is advantageous in storing, carrying, and executing the data processing program based on the present invention. With the storage media, data processing based on the present invention will easily and quickly be achievable.

The computer includes both a physical machine, namely the hardware, and the instructions which cause the physical machines to operate, namely the software. Hardware includes a central processing unit (CPU), a read only memory (ROM), a random access memory (RAM) and a hard disk drive. Software includes both application and operating system programs. If the program is simply to do task for a user, it is referred to as application software. If the program is simply to control the hardware of the computer and the execution of the application programs, it is referred to as operating system software. The operating system software controls the CPU and device drivers which control the input and output device such as keyboards, displays, floppy disk drives, CD-ROM drives and printers.

The description of the present invention has been presented for purpose of illustration and description, but is not limited to the invention in the form disclosed. Many modification and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for processing design pattern data of a semiconductor integrated circuit, comprising:

determining whether there are lower-level cells whose individual size is equal to or below a threshold;

if there are such lower-level cells whose individual size is equal to or below the threshold, pairing a first lower-level cell with a second lower-level cell, that is adjacent to the first lower-level cell, to define a new cell whose size is greater than the threshold; and replacing the first and second lower-level cells with the new cell.

2. The method of claim 1, including:

counting the number of times of appearance of the pair of the first and second lower-level cells; and defining the pair of the first and second lower-level cells as the new cell if the number of times of appearance of the pair is equal to two or greater.

3. The method of claim 2, including:

counting the number of times of appearance of a first pair made of the first and second lower-level cells;

counting the number of times of appearance of a second pair made of third and fourth lower-level cells;

comparing the numbers of times of appearance of the first and second pairs with each other to find a greater number between them; and defining one of the first and second pairs corresponding to the greater number as the higher-level cell.

4. The method of claim 3, including, if the numbers of times of appearance of the first and second pairs are equal to each other:

summing data quantities of the first and second lower-level cells in the first pair, to provide a first total;

summing data quantities of the third and fourth lower-level cells in the second pair, to provide a second total;

comparing the first and second totals with each other to find a larger total between them; and defining one of the first and second pairs having the larger total as the higher-level cell.

5. The method of claim 3, including, if the numbers of times of appearance of the first and second pairs are equal to each other:

summing number of objects contained in the first and second lower-level cells in the first pair, to provide a first total;

summing number of objects contained in the third and fourth lower-level cells in the second pair, to provide a second total;

comparing the first and second totals with each other to find a larger total between them; and defining one of the first and second pairs having the larger total as the higher-level cell.

6. The method of claim 3, including, if the numbers of times of appearance of the first and second pairs are equal to each other:

totaling dimensions in a given direction of the first and second lower-level cells in the first pair, to provide a first total;

totaling dimensions in the given direction of the third and fourth lower-level cells in the second pair, to provide a second total;

comparing the first and second totals with each other to find a larger total between them; and defining one of the first and second pairs having the larger total as the higher-level cell.

7. A method for processing design pattern data of a semiconductor integrated circuit, comprising:

determining whether there are lower-level cells whose individual size is equal to or below a threshold; and if there are such lower-level cells whose individual size is equal to or below the threshold, combining the lower-level cells to define a new cell whose size is greater than the threshold; and replacing the lower-level cells with the new cell;

wherein the threshold is twice as large as the frame width which is a distance to be referred to when carrying out pattern data processing.

8. The method of claim 7, wherein the frame width is (a) a maximum inspection distance in design rule checking, (b) a scattering length of back scattering electrons in electron beam proximity effect correction, or (c) a distance of optical proximity effect in optical proximity effect correction.

9. A computer program product for processing design pattern data of a semiconductor integrated circuit, comprising:

instructions which determine whether there are lower-level cells whose individual size is equal to or below a threshold;

instructions which pair, if there are such lower-level cells whose individual size is equal to or below the threshold, a first lower-level cell with a second lower-level cell that is adjacent to the first lower-level cell, to define a new cell whose size is greater than the threshold; and instructions which replace the first and second lower-level cells with the new cell.

10. The computer program product of claim 9, including:

instructions which count the number of times of appearance of the pair of the first and second lower-level cells; and instructions which define the pair of the first and second lower-level cells as the new cell if the number of times of appearance of the pair is equal to two or greater.

11. The computer program product of claim 10, including:

instructions which count the number of times of appearance of a first pair made of the first and second lower-level cells;

instructions which count the number of times of appearance of a second pair made of third and fourth lower-level cells;

instructions which compare the numbers of times of appearance of the first and second pairs with each other to find a greater number between them; and instructions which define one of the first and second pairs corresponding to the greater number as the higher-level cell.

12. The computer program product of claim 11, including, if the numbers of times of appearance of the first and second pairs are equal to each other:

instructions which sum data quantities of the first and second lower-level cells in the first pair and provide a first total;

instructions which sum data quantities of the third and fourth lower-level cells in the second pair and provide a second total;

instructions which compare the first and second totals with each other to find a larger total between them; and instructions which define one of the first and second pairs having the larger total as the higher-level cell.

13. The computer program product of claim 11, including, if the numbers of times of appearance of the first and second pairs are equal to each other:

instructions which sum number of objects contained in the first and second lower-level cells in the first pair and provide a first total;

instructions which sum number of objects contained in the third and fourth lower-level cells in the second pair and provide a second total;

instructions which compare the first and second totals with each other to find a larger total between them; and instructions which define one of the first and second pairs having the larger total as the higher-level cell.

14. The computer program product of claim 11, including, if the numbers of times of appearance of the first and second pairs are equal to each other:

instructions which total dimensions in a given direction of the first and second lower-level cells in the first pair and provide a first total;

instructions which total dimensions in the given direction of the third and fourth lower-level cells in the second pair and provide a second total;

instructions which compare the first and second totals with each other to find a larger total between them; and instructions which define one of the first and second pairs having the larger total as the higher-level cell.

* * * * *